(12) United States Patent
Huang et al.

(10) Patent No.: US 7,714,756 B2
(45) Date of Patent: May 11, 2010

(54) DIGITAL-TO-ANALOG CONVERTER

(75) Inventors: Chen-Chih Huang, Hsin-Chu Hsien (TW); Ming-Han Lee, Taipei Hsien (TW); Chien-Ming Wu, Taoyuan County (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 11/934,056

(22) Filed: Nov. 1, 2007

(65) Prior Publication Data

US 2008/0117088 A1 May 22, 2008

(30) Foreign Application Priority Data

Nov. 16, 2006 (TW) .................................. 95142448

(51) Int. Cl.
*H03M 1/00* (2006.01)
(52) U.S. Cl. ...................................... 341/136; 341/144
(58) Field of Classification Search ................. 341/136, 341/144, 145, 58
See application file for complete search history.

(56) References Cited

U.S. PATENT DOCUMENTS 5,570,090 A * 10/1996 Cummins .................... 341/144

| 7,034,720 | B2 * | 4/2006 | Guyot ......................... 341/118 |
| 7,449,871 | B2 * | 11/2008 | Talbot et al. ................. 323/312 |
| 2003/0011247 | A1 | 1/2003 | Kajiwara |
| 2006/0033651 | A1 | 2/2006 | Guyot |

FOREIGN PATENT DOCUMENTS

TW    I244270    11/2005

* cited by examiner

*Primary Examiner*—Jean B Jeanglaude
*Assistant Examiner*—Joseph Lauture
(74) *Attorney, Agent, or Firm*—Winston Hsu (57) ABSTRACT

The present invention discloses a digital-to-analog converter (DAC), including a bias voltage generating unit, a digital-to-analog converting stage, and an operating amplifier. The bias voltage generating unit is utilized for generating a first bias voltage. The digital-to-analog converting stage is utilized for converting a digital signal into a voltage signal, the digital-to-analog converting stage includes a current source for providing a current, and a switching unit is coupled to the current source for controlling the current to pass the switching unit according to the digital signal, and a load. The current flows through the load to generate the voltage signal. The operating amplifier is coupled to the bias voltage generating unit and the digital-to-analog converting stage for controlling the current source according to the first bias voltage.

20 Claims, 6 Drawing Sheets

DIGITAL-TO-ANALOG CONVERTER

BACKGROUND OF THE INVENTION

1. Field of the Invention

The present invention relates to a digital-to-analog converter, and more particularly, to a current-steering digital-to-analog converter.

2. Description of the Prior Art

Figure 1:
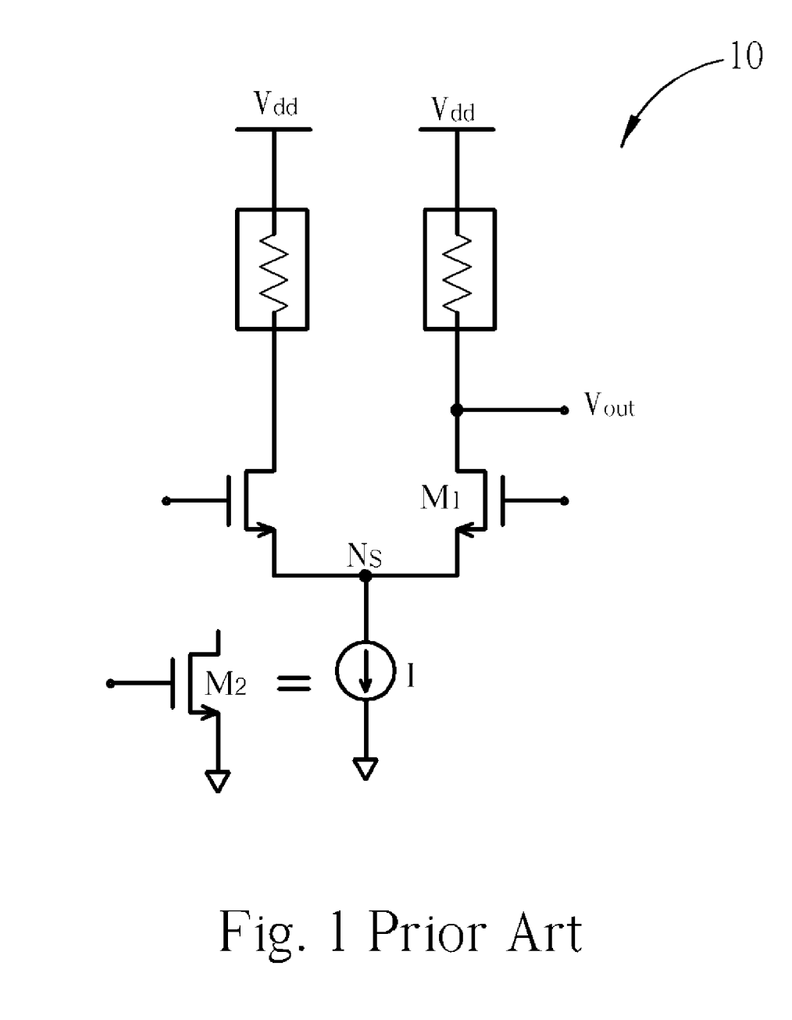
FIG. 1 is a diagram illustrating a prior art current-steering digital-to-analog converter.
Figure 2:
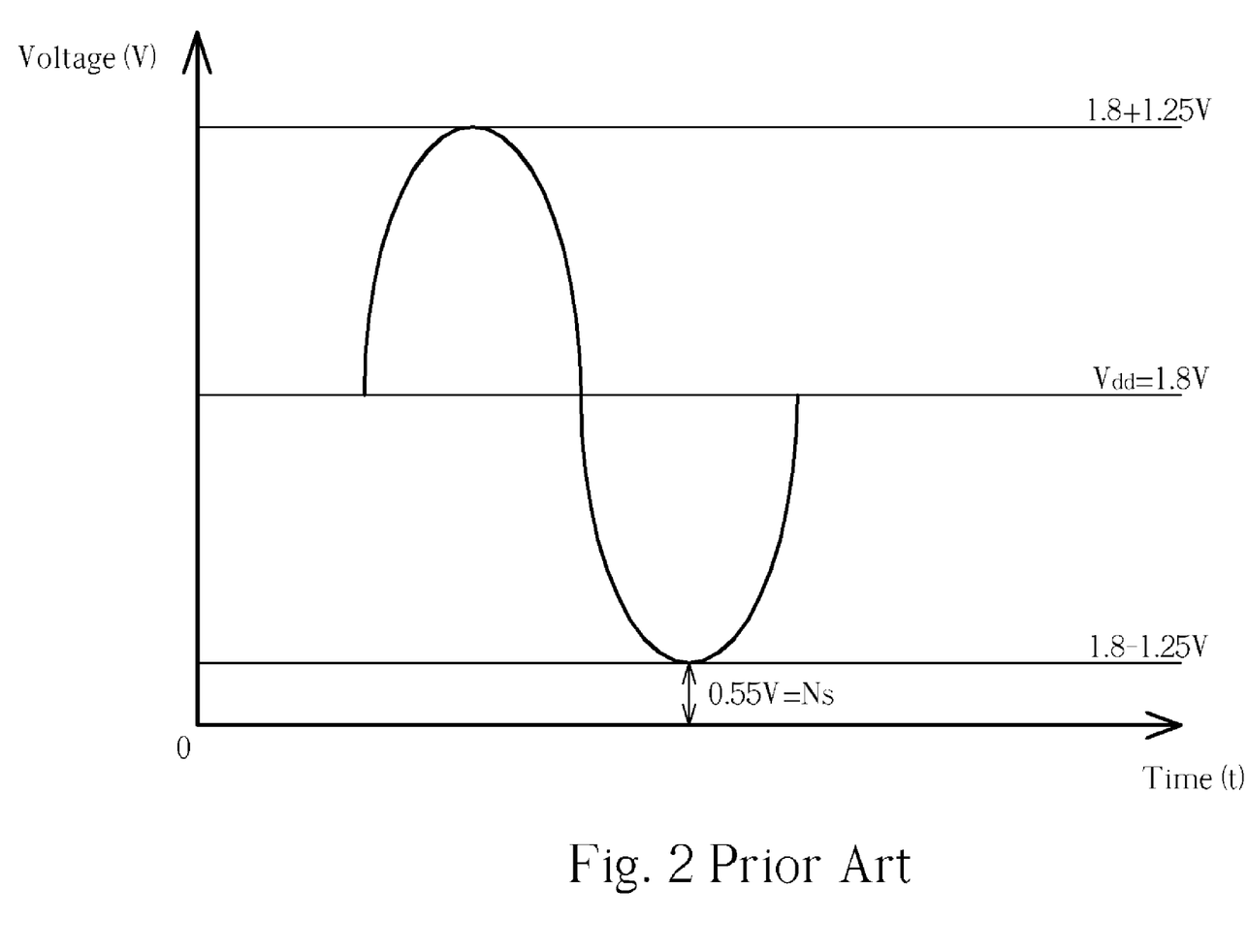
FIG. 2 is a diagram illustrating the output voltage of a single output terminal of the current-steering digital-to-analog converter as shown in FIG. 1.

Digital-to-analog converters (DAC) are one of the most important electronic devices within a communication apparatus. DACs can be classified into a number of varieties. A current-steering digital-to-analog converter is a common high-speed digital-to-analog converter, and the basic concept is to control the switching device to conduct current to charge the output terminal. Modern semiconductor processes, however, have a trend of utilizing lower supply voltage, which results in the operating voltage range of the transistor becoming narrower. Accordingly, the transistor may operate in an incorrect operation region. Please refer to FIG. 1 in conjunction with FIG. 2. FIG. 1 is a diagram illustrating a prior art current-steering digital-to-analog converter 10, and FIG. 2 is a diagram illustrating the output voltage $V_{out}$ of a single output terminal of the current-steering digital-to-analog converter 10 shown in FIG. 1. When the supply voltage Vdd=1.8V, the output voltage $V_{out}$ at the single output terminal will be operated in the range of Vdd−1.25 to Vdd+1.25. Accordingly, the lowest output voltage at the source terminal of the transistor $M_1$ is 0.55V, therefore the output stage transistor $M_2$, which provides the current I, is unable to operate under the saturation region and drops into the triode region. Therefore, the output current will be decreased and cause the distortion of the differential output signal.

SUMMARY OF THE INVENTION

One of the objectives of the present invention is to provide a current-steering digital-to-analog converter having a stable biasing current, to solve the above-mentioned problems.

According to an embodiment of the present invention, a digital-to-analog converter is provided. The digital-to-analog converter comprises a bias voltage generating unit, a digital-to-analog converting stage, and an operating amplifier. The bias voltage generating unit is utilized for generating a first biasing voltage; and the digital-to-analog converting stage is utilized for converting a digital signal into a voltage signal. The digital-to-analog converting stage comprises a current source for generating a current, a switching unit coupled to the current source for controlling the current to pass the switching unit according to the digital signal; and a load for outputting the voltage signal when the current flows through the load. The operating amplifier is coupled to the bias voltage generating unit and the digital-to-analog converting stage for controlling the current source according to the first biasing voltage.

According to an embodiment of the present invention, a digital-to-analog converter is provided. The digital-to-analog converter comprises a bias voltage generating unit, a first current path, a digital-to-analog converting stage, and an operating amplifier. The bias voltage generating unit is utilized for generating a first biasing voltage. The bias voltage generating unit comprises a first current path for generating a first current according to a control signal, and a digital-to-analog converting stage for converting a digital signal into a voltage signal. The digital-to-analog converting stage comprises a second current path, where a second current flows through the second current path; and a load for outputting the voltage signal when the second current flows through the load. The operating amplifier is coupled to the bias voltage generating unit, the first current path, and the digital-to-analog converting stage for outputting the control signal according to the first biasing voltage and adjusting the first current and the second current.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 3:
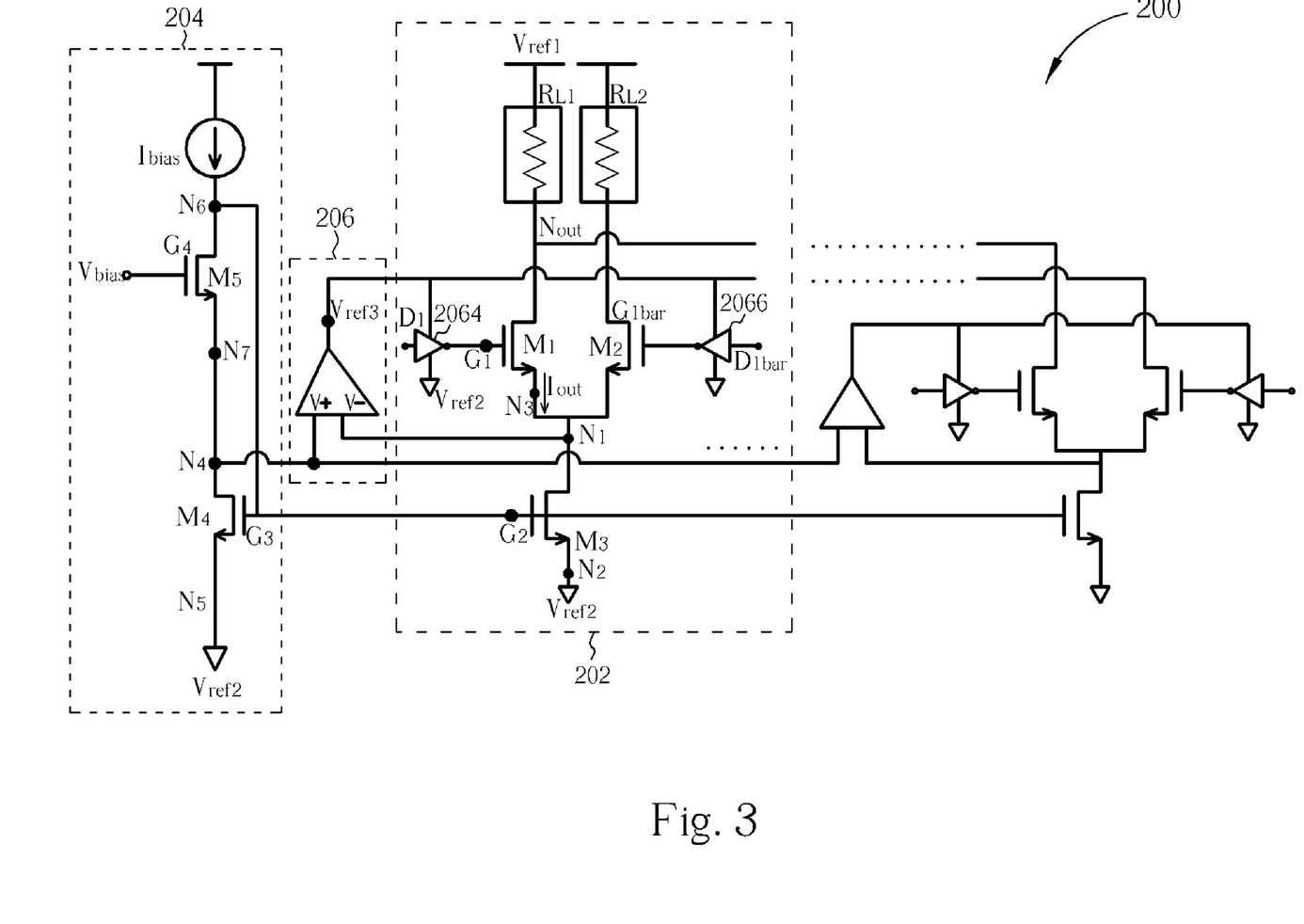
FIG. 3 is a diagram illustrating a digital-to-analog converter according to an embodiment of the present invention.

Please refer to FIG. 3. FIG. 3 is a diagram illustrating a digital-to-analog converter 200 according to a first embodiment of the present invention. The digital-to-analog converter 200 is a current steering digital-to-analog converter. The current steering digital-to-analog converter 200 comprises a bias voltage generating unit 204, a digital-to-analog converting stage 202, and an operating amplifier 206. The digital-to-analog converting stage 202 comprises a current source, a switching unit, and a load; wherein the current source comprises the transistor $M_3$, the switching unit comprises transistors $M_1$, $M_2$, and the load comprises two transistors $R_{L1}$, $R_{L2}$. The bias voltage generating unit 204 comprises a reference current source $I_{bias}$, a transistor $M_5$, and a transistor $M_4$. The operating amplifier 206 is coupled to the bias voltage generating unit 204 and the digital-to-analog converting stage 202, and the connecting relationship is as shown in FIG. 3. Please note that the first embodiment of the present invention further comprises a plurality of operating amplifiers, a plurality of current sources, and a plurality of switching units, as shown in FIG. 3. However, due to the plurality of operating amplifiers, current sources, and switching units comprise the same configurations as the operating amplifier 206, the current source (i.e. transistor $M_3$), and the switching unit (i.e. transistors $M_1$, $M_2$) respectively, detailed descriptions are omitted here for brevity. Therefore, the following description only details the configurations and operations of the bias voltage generating unit 204, the digital-to-analog converting stage 202, and the operating amplifier 206.

According to the first embodiment of the present invention as shown in FIG. 3, the reference current source $I_{bias}$ is utilized for generating a reference current, and the reference current passes through the transistor $M_5$ and the transistor $M_4$ to provide the first bias voltage V+ at the connecting terminal $N_4$, wherein the gate terminal of the transistor $M_5$ receives a reference voltage $V_{bias}$. After the operating amplifier 206 receives the first bias voltage V+ generated by the bias voltage generating unit 204, the operating amplifier 206 outputs a voltage level Vref3 to the level converting devices 2064, 2066 to become the operating voltage of the level converting devices 2064, 2066. Please note that the level converting devices 2064, 2066 can be implemented by inverters or other circuits that have the function of converting voltage levels. When the input signal $D_1$ is a low logic value, the level converting device 2064 converts the input signal $D_1$ into the supply voltage level $V_{ref3}$ of the operating amplifier 206, and outputs the supply voltage level $V_{ref3}$ at the gate terminal $G_1$. As the input signal $D_1$ and the input signal $D_{1bar}$ form a differential signal, when the input signal $D_1$ is at a low logic value, the $D_{1bar}$ is a high logic value. The level converting device 2066 outputs the operating voltage $V_{ref2}$ to the gate terminal $G_1$. In this embodiment, the supply voltage level $V_{ref3}$ is a high logic value, and the voltage level $V_{ref2}$ is a low logic value, therefore the transistor $M_1$ is conducting, resulting in an output current $I_{out}$ generated by the transistor $M_3$ to flow through the path formed by the load $R_{L1}$, the transistor $M_1$, and the transistor $M_3$. Accordingly, the second bias voltage V− is generated at the drain terminal $N_1$ of the transistor $M_3$. If the operating amplifier 206 is an ideal operating amplifier, when the second bias voltage V− is a differential of the first bias voltage V+, the loop formed by the operating amplifier 206 and the transistor $M_1$ will adjust the second bias voltage V− of the transistor $M_3$ to equal the first bias voltage V+ of the transistor $M_4$ according to the feedback loop mechanism. For example, when the second bias voltage V− is lower than the first bias voltage V+, the supply voltage level $V_{ref3}$ outputted by the operating amplifier 206 will be increased, thereby increasing the output current $I_{out}$ that flows through the transistor $M_1$. Accordingly, the second bias voltage V− will be increased. Finally, the second bias voltage V− can be adjusted to equal the first bias voltage V+. Therefore, a required ratio between the current generated by the transistor $M_3$ (i.e. the current source) and the reference current source $I_{bias}$ can be obtained.

According to the aforementioned disclosure, when the bias current $I_{bias}$ is a predetermined value, and the aspect ratios (W/L) and the bias conditions of the transistor $M_4$ and the transistor $M_3$ are the same (i.e. the bias voltages at the gate terminals, the drain terminals, and the source terminals of both transistors are the same), then the output current $I_{out}$ is forced to be equal to the bias current $I_{bias}$ substantially, no matter whether the transistors $M_4$ and $M_3$ are operated under the saturation region or the triode region. In other words, even under the supply voltage of 1.6V utilized in the aforementioned prior art, the current steering digital-to-analog converter 200 can keep the output voltage at the output terminal $N_{out}$ during a normal operation with no distortion upon the output voltage.

Figure 4:
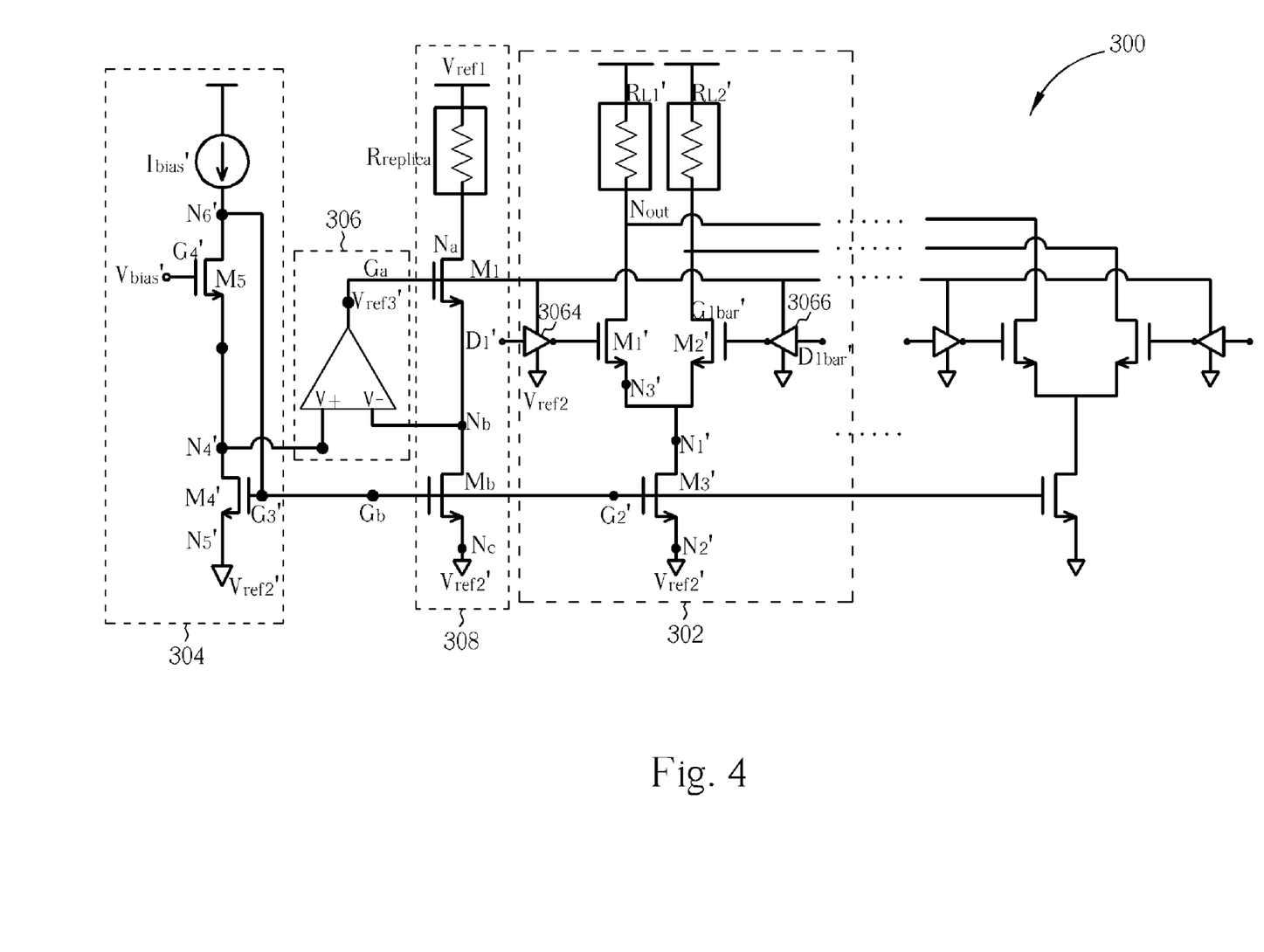
FIG. 4 is a diagram illustrating a digital-to-analog converter according to a second embodiment of the present invention.

Please refer to FIG. 4. FIG. 4 is a diagram illustrating a digital-to-analog converter 300 according to a second embodiment of the present invention. The digital-to-analog converter 300 is a current steering digital-to-analog converter. The current steering digital-to-analog converter 300 comprises a bias generating unit 304, a digital-to-analog converting unit 302, a first current path 308, and an operating amplifier 306. The digital-to-analog converting stage 302 comprises a second current path and a load; wherein the second current path comprises a current source (i.e. transistor $M_3'$) and a switching unit (i.e. transistors $M_1'$, $M_2'$), and the load comprises two transistors $R_{L1}'$, $R_{L2}'$. The operating amplifier 306 is coupled to the bias voltage generating unit 304 and the first current path 308. Please note that the second embodiment of the present invention further comprises a plurality of current sources, and a plurality of switching units, as shown in FIG. 4. However, as the plurality of current sources and switching units comprises the same configurations as the current source (i.e. transistor $M_3'$), and the switching unit (i.e. transistors $M_1'$, $M_2'$) respectively, detailed descriptions are omitted here for brevity. Therefore, the following description only describes the configurations and operations of the bias voltage generating unit 304, the digital-to-analog converting stage 302, the first current path 308 and the operating amplifier 306.

The bias voltage generating unit 304 is coupled to the digital-to-analog converting stage 302 and comprises a reference current source $I_{bias}'$, a transistor $M_4'$, and a transistor $M_5'$. In this embodiment, the first current path 308 is a replica circuit, which comprises a replica switching transistor $M_a$, a replica bias voltage transistor $M_b$, and a replica load $R_{replica}$. A terminal of the replica load $R_{replica}$ is coupled to the first reference voltage level $V_{ref1}'$, and the characteristic of the replica load $R_{replica}$ is substantially the same as the characteristic of the loads $R_{L1}'$ and $R_{L2}'$. For the replica switching transistor $M_a$, the transistor characteristic is substantially the same as the characteristic of the transistors $M_1'$ and $M_2'$. Furthermore, a gate terminal $G_a$ of the replica switching transistor $M_a$ is coupled to the gate terminal $G_1'$ of the transistor $M_1'$, and a drain terminal $N_a$ of the replica switching transistor $M_a$ is coupled to another terminal of the replica load $R_{replica}$. For the replica bias voltage transistor $M_b$, the transistor's characteristic is substantially the same as the characteristic of the transistor $M_3'$, and the replica bias voltage transistor $M_b$ comprises a gate terminal $G_b$, a drain terminal $N_b$, and a source terminal $N_c$, wherein the drain terminal $N_b$ of the replica bias voltage transistor $M_b$ is coupled to a source terminal $N_c$ of the replica switching transistor $M_a$.

According to the second embodiment of the present invention as shown in FIG. 4, the operating amplifier 306 adjusts a supply voltage level Vref3 according to the voltage difference between the second bias voltage V− at the drain terminal $N_b$ of the replica bias voltage transistor $M_b$ and the first bias voltage V+ at the drain terminal N4' of the transistor M4'. The level converting device 3064 is coupled to the output terminal of the operating amplifier 306 for selecting a voltage level to become the voltage of gate terminal $G_1'$ according to the logic value of the input signal $D_1'$, in which the voltage level is one of the supply voltage level $V_{ref3}'$ and the second reference voltage level $V_{ref2}'$. Similarly, the other level converting device 3066 is also coupled to the output terminal of the operating amplifier 306 for selecting a voltage level to become the voltage of gate terminal $G_{1bar}'$ according to the logic value of the input signal $D_{1bar}'$, in which the voltage level is one of the supply voltage level $V_{ref3}'$ and the second reference voltage level $V_{ref2}'$. Please note that the operations of the current steering digital-to-analog converter 300 as shown in FIG. 4 are similar to the current steering digital-to-analog converter 200 as shown in FIG. 3. The operating amplifier 306 utilizes the bias voltage generating unit 304 to generate the first bias voltage, and outputs a voltage level $V_{ref3}'$ to control the transistor $M_1'$ positioned on the first current path 308 for adjusting the current of the first current path 308. Furthermore, the output terminal of the operating amplifier 306 also generates the voltage level $V_{ref3}'$ to the level converting devices 3064, 3066 of the digital-to-analog converting unit 302 for adjusting the current generated by the digital-to-analog converting unit 302. Accordingly, a required ratio between the current generated by the transistor $M_3'$ (i.e. the current source) and the reference current source $I_{bias}'$ can be obtained. If the aspect ratios (W/L) of the transistors $M_4$ and $M_3$ are the same, then the biasing conditions of the transistors $M_4$ and $M_3$ are substantially the same (i.e. the voltages at the gate terminals, the drain terminals, and the source terminals of both transistors are the same), therefore the output current $I_{out}$ of the transistor $M_3$ is equal to the bias current $I_{bias}$.

Please note that, in the first and the second embodiments of the present invention, the transistors of the switching units of the digital-to-analog converters 200, 300 are not limited to utilizing just one transistor. In other words, transistors configured in a cascade configuration also belong to the scope of the present invention. Furthermore, although the level converting devices are implemented by inverters in the embodiments as shown in FIG. 3 and FIG. 4, this is also not a limitation of the present invention. For example, in other embodiments, the level converting device can be implemented by a latching device.

Figure 5:
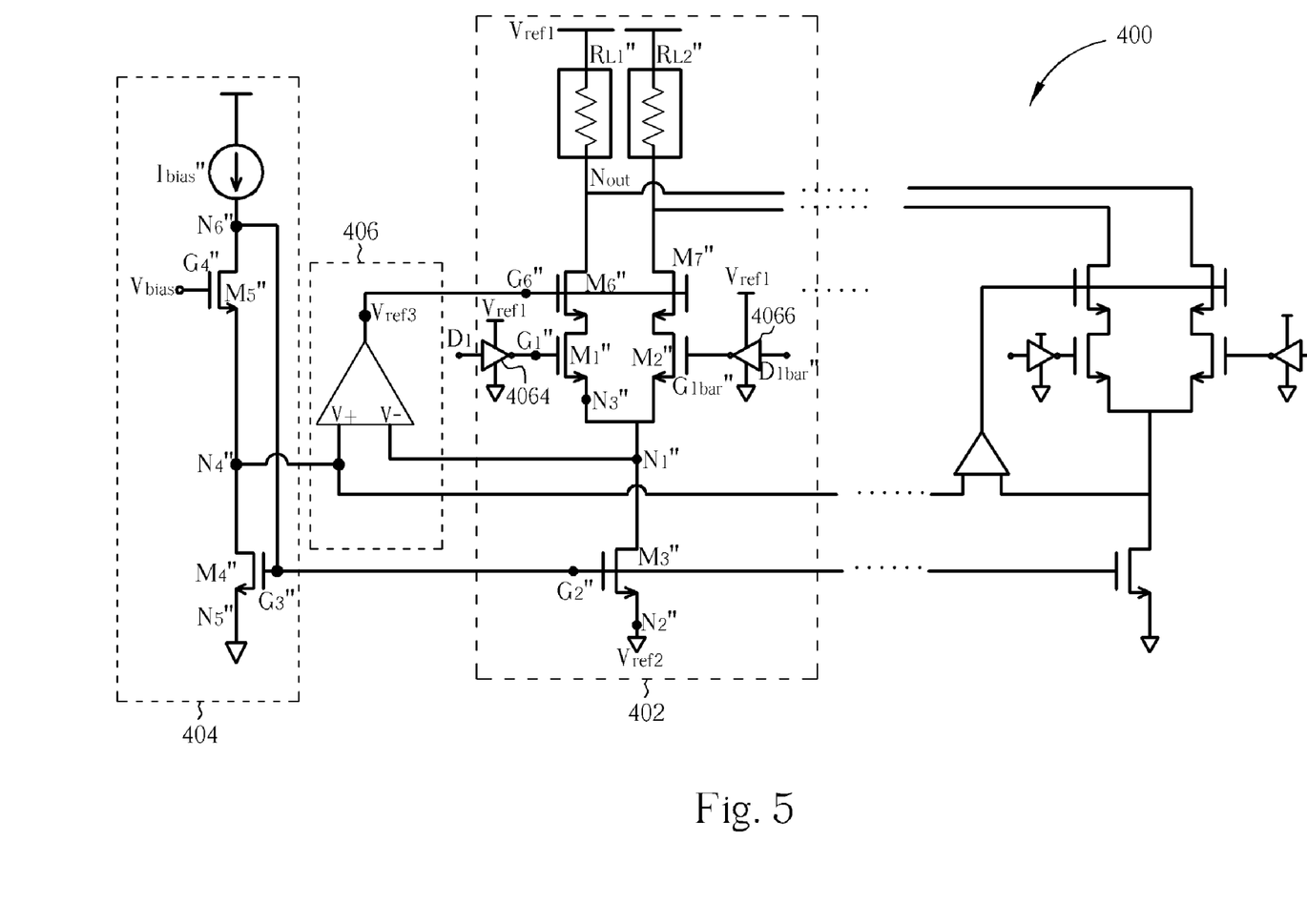
FIG. 5 is a diagram illustrating a digital-to-analog converter according to a third embodiment of the present invention.

Please refer to FIG. 5. FIG. 5 is a diagram illustrating a digital-to-analog converter 400 according to a third embodiment of the present invention. The digital-to-analog converter 400 is a current steering digital-to-analog converter. The current steering digital-to-analog converter 400 is similar to the digital-to-analog converter 200, and comprises a bias generating unit 404, a digital-to-analog converting unit 402, and an operating amplifier 406. The digital-to-analog converting stage 402 comprises a current source, a switching device, a controlling transistor unit, and a load. The current source comprises a transistor $M_3'$, the switching device comprises transistors $M_1''$, $M_2''$, the controlling transistor unit comprises transistors $M_6''$, $M_7''$, and the load comprises two resistors $R_{L1}''$, $R_{L2}''$. Furthermore, the transistors $M_6''$, $M_7''$ of the controlling transistor unit are implemented by the transistors within the I/O pad, meaning that the transistors $M_6''$, $M_7''$ are implemented by the I/O fabricating process. The operating amplifier 406 is coupled to the bias voltage generating unit 404 and the digital-to-analog converting unit 402. Please note that the third embodiment of the present invention further comprises a plurality of operating amplifiers, a plurality of current sources, and a plurality of switching units, as shown in FIG. 5. However, due to the plurality of operating amplifiers, the plurality of current sources, and the plurality of switching units comprise the same configurations as the operating amplifier 406, the current source (i.e. transistor $M_3''$), and the controlling unit (i.e. transistors $M_1''$, $M_2''$, $M_6''$, $M_7''$) respectively, detailed descriptions are omitted here for brevity. Therefore, the following description only describes the configurations and operations of the bias voltage generating unit 404, the digital-to-analog converting stage 402, and the operating amplifier 406.

According to the third embodiment of the present invention as shown in FIG. 5, the operating amplifier 406 generates a supply voltage level $V_{ref3}$ to control the transistors $M_6''$, $M_7''$ according to the bias voltage V+ at the drain terminal $N_4$ of the transistor $M_4''$. The level converting device 4064 (e.g. inverter) is coupled to the gate terminal of the transistor $M_1''$ for selecting a voltage level to become the voltage of the gate terminal $G_1''$ according to the logic value of the input signal $D_1$, in which the voltage level is one of the supply voltage level $V_{ref1}$ (e.g. supply voltage $V_{dd}$) and the second reference voltage level $V_{ref2}$ (e.g. ground voltage $V_{gnd}$). Similarly, the other level converting device 4066 (e.g. inverter) is also coupled to the gate terminal of the transistor $M_2''$ for selecting a voltage level to become the voltage of the gate terminal $G_{1bar}''$ according to the logic value of the input signal $D_{1bar}$, in which the voltage level is one of the supply voltage level $V_{ref1}$ (e.g. supply voltage $V_{dd}$) and the second reference voltage level $V_{ref2}$ (e.g. ground voltage $V_{gnd}$). The operating amplifier 406 utilizes the first bias voltage V+ generated by the bias voltage generating unit 404 to output a voltage level $V_{ref3}$ to control the transistors $M_6''$ and $M_7''$ for adjusting the current generated by the transistor $M_3''$. Accordingly, a required ratio between the current generated by the transistor $M_3''$ (i.e. the current source) and the reference current source $I_{bias}''$ can be obtained. If the aspect ratios (W/L) of the transistors $M_4''$ and $M_3''$ are the same, then the biasing conditions of the transistors $M_4''$ and $M_3''$ are substantially the same (i.e. the voltages at the gate terminals, the drain terminals, and the source terminals of both transistors are the same), therefore the output current $I_{out}$ of the transistor $M_3''$ is equal to the bias current $I_{bias}''$.

Figure 6:
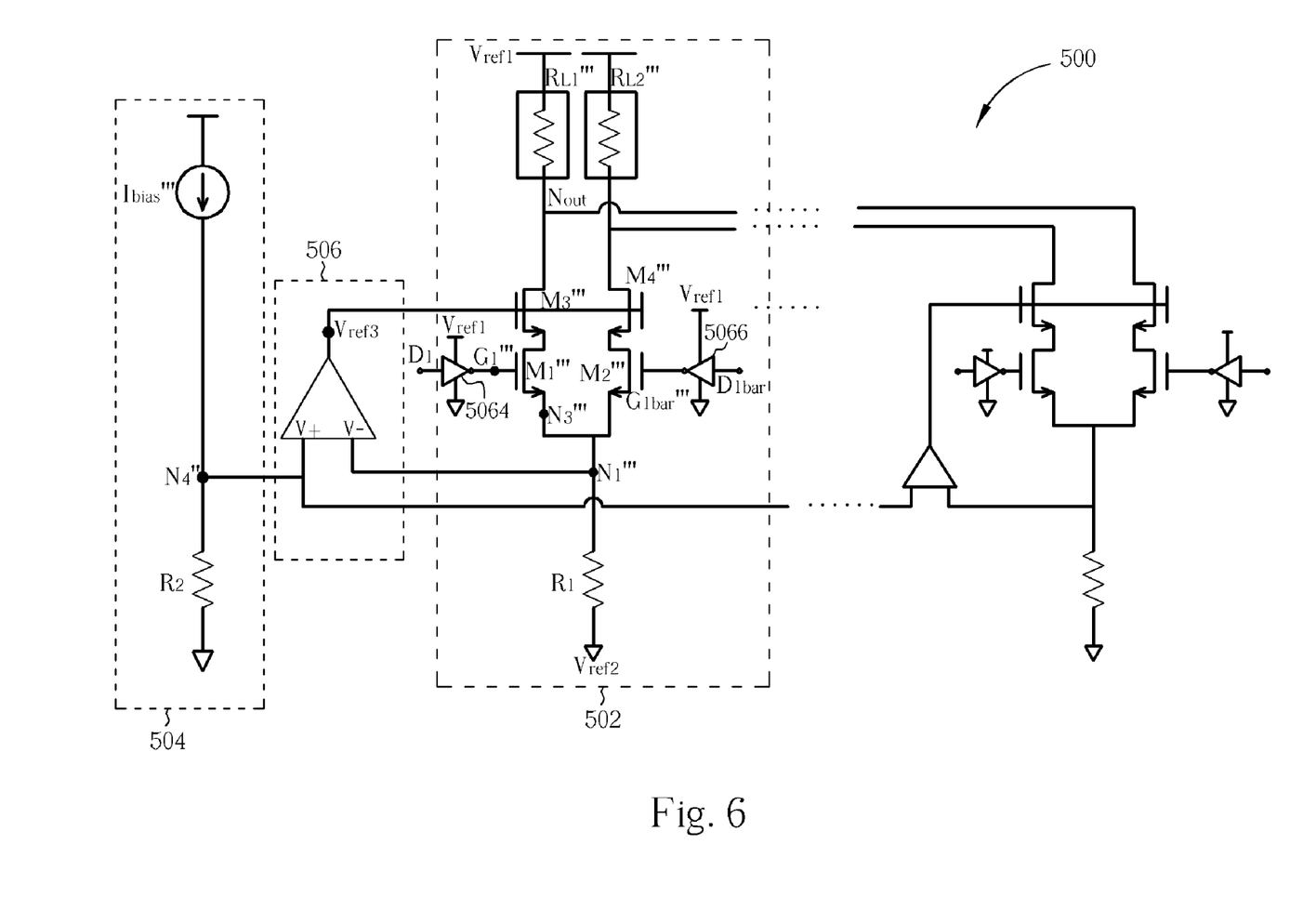
FIG. 6 is a diagram illustrating a digital-to-analog converter according to a fourth embodiment of the present invention.

Please refer to FIG. 6. FIG. 6 is a diagram illustrating a digital-to-analog converter 500 according to a fourth embodiment of the present invention. The digital-to-analog converter 500 is a current steering digital-to-analog converter. The current steering digital-to-analog converter 500 is similar to the digital-to-analog converter 400, and comprises a bias generating unit 504, a digital-to-analog converting unit 502, and an operating amplifier 506. The digital-to-analog converting stage 502 comprises a current source, a switching device, a controlling transistor unit, and a load. The current source comprises a resistor $R_1$, the switching device comprises transistors $M_1'''$, $M_2'''$, the controlling transistor unit comprises transistors $M_3'''$, $M_4'''$, and the load comprises two resistors $R_{L1}'''$, $R_{L2}'''$. The operating amplifier 506 is coupled to the bias voltage generating unit 504 and the digital-to-analog converting unit 502. Please note that the current source $M_3''$ of the digital-to-analog converting unit 402 is an active device while the current source $M_3'''$ of the digital-to-analog converting unit 502 is a passive device in this embodiment. Furthermore, the values of the resistor R1 can be the same as the resistor R2, or the values of the resistor R1 can be different from the resistor R2, which depends on the designing requirement and operating circumstance. The present invention further comprises a plurality of operating amplifiers, a plurality of current sources, and a plurality of switching units, as shown in FIG. 6. However, as the operation of the fourth embodiment is similar to the third embodiment of the present invention, detailed description is omitted here for brevity. In other words, the digital-to-analog converter 500 utilizes the operating amplifier 506 to adjust the current of the digital-to-analog converting unit 504, resulting in the current of the digital-to-analog converting unit 502 matching the current of the bias voltage generating unit 504.

Furthermore, the concept of utilizing the replica circuit in FIG. 4 can also be utilized in the embodiments as shown in FIG. 5 and FIG. 6, and those skilled in this art will easily be able to modify the embodiments as shown in FIG. 5 and FIG. 6 by utilizing the concept of the replica circuit, thus a detailed description is omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A digital-to-analog converter, comprising:
   a bias voltage generating unit, for generating a first biasing voltage on a first node and generating a reference current through the first node;
   a digital-to-analog converting stage, for converting a digital signal into a voltage signal, the digital-to-analog converting stage comprising:
      a current source, for generating a current, wherein the current flows through a second node;
      a switching unit, coupled to the current source, for controlling the current to pass the switching unit according to the digital signal; and
      a load, for outputting the voltage signal when the current flows through the load; and
   an operating amplifier, coupled to the bias voltage generating unit and the digital-to-analog converting stage, for controlling the current source according to the first biasing voltage;
   wherein a first input and a second input of the operating amplifier are respectively coupled to the first node and the second node such that the voltage on the first node and the voltage on the second node are substantially equal, and such that the current and the reference current have a predetermined ratio.

2. The digital-to-analog converter of claim 1, wherein the bias voltage generating unit comprises:
   a reference current source, for outputting the reference current to generate the first bias voltage;
   wherein the current corresponds to the reference current.

3. The digital-to-analog converter of claim 1, wherein the second input of the operating amplifier is coupled to the current source of the digital-to-analog converting stage, for adjusting the current.

4. The digital-to-analog converter of claim 1, wherein the current source is an active device.

5. The digital-to-analog converter of claim 4, wherein the active device is a transistor.

6. The digital-to-analog converter of claim 1, wherein the current source is a passive device.

7. The digital-to-analog converter of claim 6, wherein the passive device is a resistor.

8. The digital-to-analog converter of claim 1, further comprising:
   a level converting device, coupled between the output terminal of the operating amplifier and the switching unit, for adjusting the voltage level of the digital signal according to the output signal of the operating amplifier.

9. The digital-to-analog converter of claim 8, wherein the level converting device is an inverter or a latch.

10. The digital-to-analog converter of claim 1, wherein the digital-to-analog converting stage further comprises:
    a transistor, coupled between the switching unit and the load, for adjusting the current according to the output signal of the operating amplifier.

11. The digital-to-analog converter of claim 10, wherein the transistor is implemented by an I/O fabricating process.

12. The digital-to-analog converter of claim 1, where the digital-to-analog converter is a current steering digital-to-analog converter.

13. A digital-to-analog converter, comprising:
    a bias voltage generating unit, for generating a first biasing voltage on a first node and generating a reference current through the first node;
    a first current path, for generating a first current according to a control signal, wherein the first current flows through a second node;
    a digital-to-analog converting stage, for converting a digital signal into a voltage signal, the digital-to-analog converting stage comprising:
       a second current path, where a second current flows through the second current path; and
       a load, for outputting the voltage signal when the second current flows through the load; and
    an operating amplifier, coupled to the bias voltage generating unit, the first current path, and the digital-to-analog converting stage, for outputting the control signal according to the first biasing voltage to adjust the first current and the second current;
    wherein a first input and a second input of the operating amplifier are respectively coupled to the first node and the second node such that the voltage on the first node and the voltage on the second node are substantially equal, and such that the first current and the reference current have a predetermined ratio.

14. The digital-to-analog converter of claim 13, wherein the bias voltage generating unit comprises:
    a reference current source, for outputting the reference current to generate the first bias voltage;
    wherein the first and the second currents correspond to the reference current.

15. The digital-to-analog converter of claim 13, wherein the second current path comprises:
    a current source, for generating the second current; and
    a switching unit, coupled to the current source, for controlling the second current to pass the switching unit according to the digital signal.

16. The digital-to-analog converter of claim 15, further comprising:
    a level converting device, coupled between the operating amplifier and the switching unit, for adjusting the voltage level of the digital signal according to the control signal.

17. The digital-to-analog converter of claim 16, wherein the level converting device is an inverter or a latch.

18. The digital-to-analog converter of claim 15, wherein the current source is a transistor.

19. The digital-to-analog converter of claim 15, wherein the current source is a resistor.

20. The digital-to-analog converter of claim 13, where the digital-to-analog converter is a current steering digital-to-analog converter.

* * * * *